(12) United States Patent
Park et al.

(10) Patent No.: US 10,978,012 B2
(45) Date of Patent: *Apr. 13, 2021

(54) DISPLAY DEVICE AND METHOD FOR DRIVING THE SAME

(71) Applicant: SAMSUNG DISPLAY CO., LTD., Yongin-si (KR)

(72) Inventors: Sang Jun Park, Yongin-si (KR); Kyun Ho Kim, Hwaseong-si (KR); Shim Ho Yi, Seoul (KR); Yong Jin Shin, Asan-si (KR); Yu Chol Kim, Pyeongtaek-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/898,011

(22) Filed: Jun. 10, 2020

(65) Prior Publication Data
US 2020/0302884 A1    Sep. 24, 2020

Related U.S. Application Data

(63) Continuation of application No. 15/801,899, filed on Nov. 2, 2017, now Pat. No. 10,714,035.

(30) Foreign Application Priority Data

Nov. 11, 2016  (KR) .................. 10-2016-0150101

(51) Int. Cl.
*G09G 3/36*    (2006.01)
*G09G 3/20*    (2006.01)
(Continued)

(52) U.S. Cl.
CPC ..... *G09G 3/3607* (2013.01); *G02F 1/133621* (2013.01); *G09G 3/2003* (2013.01);
(Continued)

(58) Field of Classification Search
CPC .. G09G 3/3607; G09G 3/2003; G09G 3/3413; G09G 3/3258; G09G 3/2092;
(Continued)

(56) References Cited

U.S. PATENT DOCUMENTS

2004/0095308 A1* 5/2004 Kim .................. G09G 3/3648
                                                345/99
2004/0150857 A1* 8/2004 Sawada ................ G06T 5/003
                                                358/2.1
(Continued)

FOREIGN PATENT DOCUMENTS

KR  10-1999-0054519   12/1999
KR  10-2001-0082963    8/2001
KR  10-2002-0014330    2/2002

*Primary Examiner* — Ibrahim A Khan
(74) *Attorney, Agent, or Firm* — F. Chau & Associates, LLC

(57) ABSTRACT

A display device capable of setting an optimal output enable value according to a color pattern and a method for driving the display device. A timing controller is configured to receive an image signal from an external source, identify a color pattern and set an output enable value corresponding to the identified color pattern. A scan driver is configured to receive the output enable value and generate a first scan signal having a first turn-on signal and a second scan signal adjacent to the first scan signal and having a second turn-on signal. The scan driver may adjust an interval between the first turn-on signal and the second turn-on signal based on the output enable value.

19 Claims, 9 Drawing Sheets

(51) Int. Cl.
*G02F 1/13357* (2006.01)
*G09G 3/3258* (2016.01)
*G09G 3/34* (2006.01)
*H01L 27/32* (2006.01)

(52) U.S. Cl.
CPC ......... *G09G 3/2092* (2013.01); *G09G 3/3258* (2013.01); *G09G 3/3413* (2013.01); *H01L 27/3206* (2013.01); *H01L 27/3213* (2013.01); *G09G 2360/16* (2013.01)

(58) Field of Classification Search
CPC ............ G09G 2360/16; H01L 27/3213; H01L 27/3206; G02F 1/133621
See application file for complete search history.

(56) References Cited

U.S. PATENT DOCUMENTS

| | | | | |
|---|---|---|---|---|
| 2005/0083356 A1* | 4/2005 | Roh | ....................... | G09G 5/005 345/698 |
| 2006/0033698 A1* | 2/2006 | Chen | ..................... | G09G 3/3648 345/102 |
| 2006/0104509 A1* | 5/2006 | Park | ..................... | H04N 1/6027 382/167 |
| 2007/0046609 A1* | 3/2007 | Lee | ....................... | G09G 3/3648 345/94 |
| 2007/0262941 A1* | 11/2007 | Jan | ....................... | G09G 3/3614 345/96 |
| 2008/0007505 A1* | 1/2008 | Kim | ..................... | G09G 3/3648 345/90 |
| 2008/0030490 A1* | 2/2008 | Son | ....................... | G09G 3/3648 345/205 |
| 2008/0049042 A1* | 2/2008 | Yang | ................... | G09G 3/3607 345/589 |
| 2008/0084408 A1* | 4/2008 | Nishimura | ........... | G09G 3/3677 345/205 |
| 2008/0122766 A1* | 5/2008 | Pai | ....................... | G09G 3/3677 345/87 |
| 2008/0192032 A1* | 8/2008 | Park | ..................... | G09G 3/3677 345/204 |
| 2009/0213056 A1* | 8/2009 | Nam | ..................... | G09G 3/3648 345/90 |
| 2010/0091046 A1* | 4/2010 | Matsuura | ............. | G09G 3/3677 345/690 |
| 2010/0245333 A1* | 9/2010 | Hsu | ........................ | G09G 3/3648 345/213 |
| 2011/0050561 A1* | 3/2011 | Liu | ......................... | G09G 3/344 345/107 |
| 2011/0122106 A1* | 5/2011 | Li | .......................... | G09G 3/3648 345/205 |
| 2012/0223927 A1* | 9/2012 | Hsieh | ...................... | G09G 3/36 345/211 |
| 2014/0028657 A1* | 1/2014 | Kobayashi | ........... | G09G 3/3696 345/212 |
| 2016/0196799 A1* | 7/2016 | Ahn | ..................... | G09G 3/3648 345/213 |
| 2018/0137828 A1 | 5/2018 | Park et al. | | |

* cited by examiner

DISPLAY DEVICE AND METHOD FOR DRIVING THE SAME

CROSS-REFERENCE TO RELATED APPLICATION

This application claims priority to Korean Patent Application No. 10-2016-0150101 filed on Nov. 11, 2016 and U.S. patent application Ser. No. 15/801,899 filed on Nov. 2, 2017, the contents of which are incorporated by reference herein.

TECHNICAL FIELD

The inventive concept relates to a display device and a method for driving the same.

DISCUSSION OF THE RELATED ART

Display devices are becoming increasingly popular along with the development of multimedia. Accordingly, various types of display devices, such as a liquid crystal display (LCD), an organic light emitting display (OLED) and the like, are now in use.

A liquid crystal display, which is one of the most widely used flat panel display devices, includes two substrates on which field generating electrodes such as pixel electrodes and a common electrode are formed, and a liquid crystal layer is interposed between the two substrates. The liquid crystal display may display an image by applying a voltage to the field generating electrodes to generate an electric field in a liquid crystal layer, by determining the direction of liquid crystal molecules in the liquid crystal layer, and by controlling the polarization of incident light.

Further, among the display devices, an organic light emitting display displays an image through the use of an organic light emitting device that generates light by recombination of electrons and holes. The organic light emitting display has benefits in that it has a relatively high response speed, a large luminance and a wide viewing angle, and is driven with a relatively low power consumption.

SUMMARY

The inventive concept may provide a display device capable of setting an optimal output enable value according to a color pattern and a method for driving the display device.

The display device according to an embodiment of the present inventive concept recognizes (e.g. identifies) a color pattern, sets an optimal output enable value corresponding to the recognized color pattern, and is driven according to the optimal output enable value, to enhance a charging rate.

Further, since the charging rate is enhanced by setting the optimal output enable value, it is possible to reduce a vertical moire phenomenon and a horizontal block phenomenon.

In an embodiment of the inventive concept, the output enable value set by the timing controller includes a first output enable value corresponding to the monochromatic pattern of the identified color pattern and a second output enable value corresponding to the white pattern of the identified color pattern, and the first output enable value corresponding to the monochromatic pattern is smaller than the second output enable value corresponding to the white pattern.

An embodiment of the present inventive concept discloses a display device comprising: a timing controller configured to receive an image signal from an external source, detect (e.g. identify) a color pattern and set an output enable value corresponding to the detected color pattern; and a scan driver configured to receive the output enable value and generate a first scan signal having a first turn-on signal and a second scan signal adjacent to the first scan signal and having a second turn-on signal. The scan driver may adjust an interval between the first turn-on signal and the second turn-on signal based on the output enable value.

An embodiment of the present inventive concept also discloses a display device comprising: a display panel including a first pixel having a first switching element and a second pixel having a second switching element; a scan driver configured to provide a first scan signal including a first turn-on signal to the first switching element and to provide a second scan signal including a second turn-on signal to the second switching element; and a timing controller configured to adjust an interval between the first turn-on signal and the second turn-on signal according to a color pattern of an image signal provided from an outside (e.g. an external device).

An embodiment of the present inventive concept discloses a method for driving a display device, comprising: receiving an image signal from an external device (e.g. outside); detecting a color pattern of the image signal; setting an output enable value corresponding to the detected color pattern of the image signal; and generating a plurality of scan signals based on the output enable value.

According to an embodiment of the inventive concept, the setting of the OE value includes setting an optimal OE value according to the identified color pattern, the setting of the optimal OE value is based on reducing a vertical moire phenomenon and a horizontal block phenomenon in view of at least a charging rate of a plurality of pixels in a display panel of the display device.

In an embodiment of the inventive concept, the output enable value may be set in view of a representative value of a particular color pattern that is in storage.

In an embodiment of the inventive concept, the optimal OE value may be set on a per frame basis, or on a multi-frame basis.

BRIEF DESCRIPTION OF THE DRAWINGS

The above and other features of the present inventive concept will become more apparent by describing in detail embodiments thereof with reference to the attached drawings, in which.

DETAILED DESCRIPTION

Figure 1:
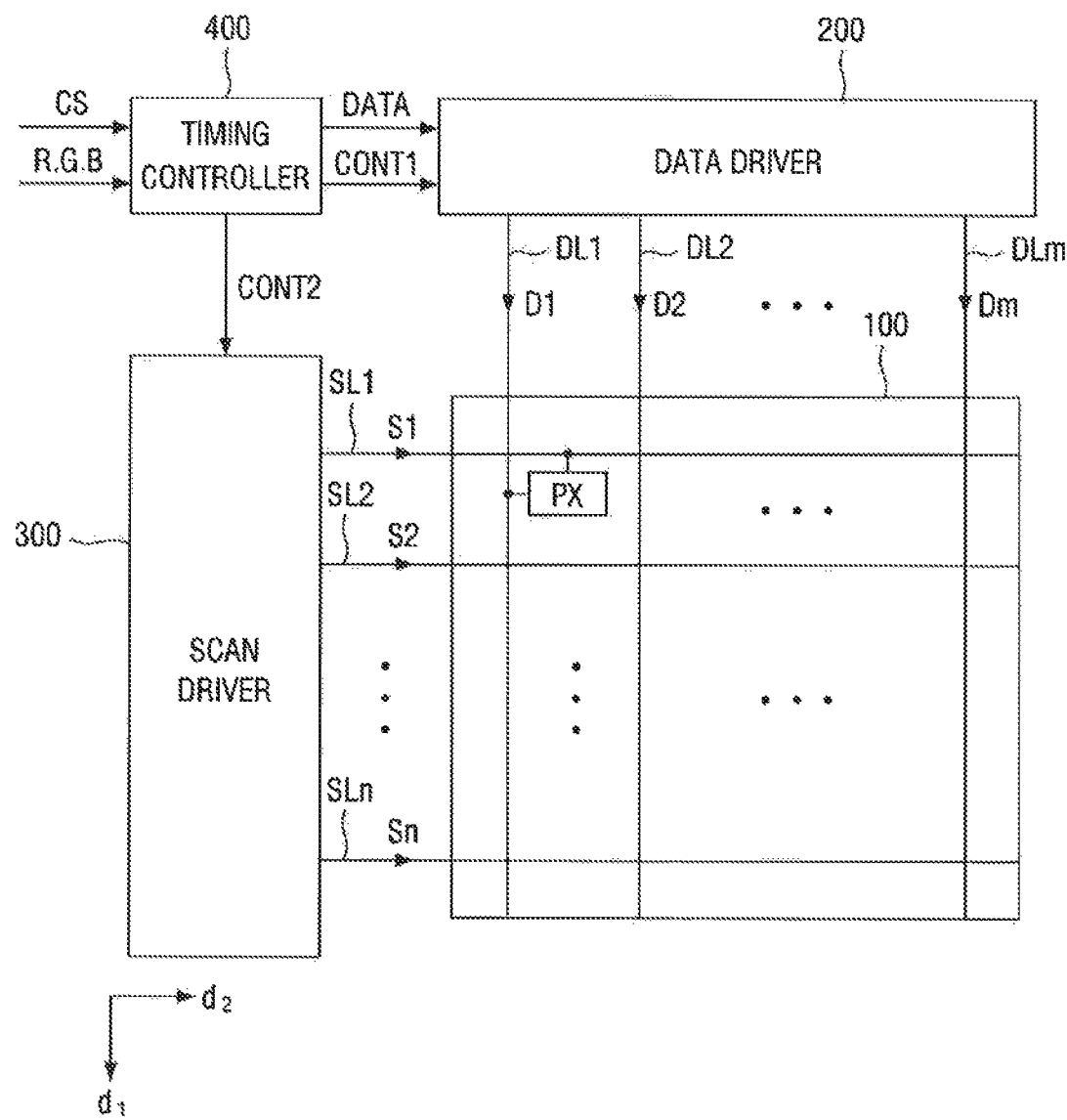
FIG. 1 is a block diagram schematically showing a display device according to an embodiment of the present inventive concept.

In the following description, for the purposes of explanation, numerous specific details are set forth to provide a thorough understanding of various embodiments. However, a person of ordinary skill in the art should appreciate that various embodiments may be practiced without these specific details, or with one or more equivalent arrangements than shown and described herein. In other instances, well-known structures and devices are shown in a block diagram format to avoid obscuring various embodiments of the inventive concept with a discussion of well-known structures.

In the accompanying figures, the size and relative sizes of layers, films, panels, regions, etc., may be exaggerated for clarity and descriptive purposes. Also, like reference numerals may denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section, and do not imply a strict order or sequence. Accordingly, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, to describe one element or feature's relationship to another element(s) or feature(s) as illustrated in the drawings. Spatially relative terms included herein encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various embodiments are described herein with reference to sectional illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, embodiments will be described with reference to the accompanying drawings.

FIG. 1 is a block diagram schematically showing a display device according to an embodiment of the present inventive concept.

The display device according to an embodiment of the present inventive concept may include a display panel 100, a data driver 200, a scan driver 300, and a timing controller 400. It should be understood by a person of ordinary skill in the art that the display device according to the present inventive concept may be implemented in virtually any type of device that utilizes a display panel.

The display panel 100 is an area for displaying an image. The display panel 100 may be, for example, a liquid crystal display panel. However, a person of ordinary skill in the art should appreciate that the inventive concept is not limited to practice with a liquid crystal display panel. The display panel 100 may be, for example, a luminescent panel on which an organic light emitting device is disposed. Herein, a case where the display panel 100 comprises a liquid crystal panel will now be described as a non-limiting example.

Accordingly, the display device according to an embodiment of the present inventive concept may be a liquid crystal display device.

The display panel 100 may be connected to the data driver 200 through first to m-th data lines DL1 to DLm (where m is a natural number of 2 or greater). Also, the display panel 100 may be connected to the scan driver 300 through first to n-th scan lines SL1 to SLn (where n is a natural number of 2 or greater).

The display panel 100 may include a plurality of pixels including a first pixel PX1. In one embodiment, each of the plurality of pixels may be electrically connected to one of the first to n-th scan lines SL1 to SLn and to one of the first to m-th data lines DL1 to DLm.

The first to m-th data lines DL1 to DLm may extend along a first direction d1. The first to n-th scan lines SL1 to SLn may extend along a second direction d2. The first direction d1 may be substantially perpendicular to the second direction d2. In an embodiment of the inventive concept, the first direction d1 may intersect the second direction d2 in one embodiment. In the example of FIG. 1, the first direction dl is defined as a column direction, and the second direction d2 is defined as a row direction. The plurality of pixels may be arranged so that they are insulated from each other on one substrate, and may be arranged in a matrix form in one embodiment.

In an embodiment, the data driver 200 may include a shift register, a latch and a digital-to-analog converter (DAC). The data driver 200 may receive a first control signal CONT1 and image data DATA from the timing controller 400. The data driver 200 may select a reference voltage corresponding to the first control signal CONT1 and convert the image data DATA of a digital waveform inputted according to the selected reference voltage into first to m-th data signals D1 to Dm. The data driver 200 may provide the generated data signals D1 to Dm to the display panel 100.

With continued reference to FIG. 1, the scan driver 300 may receive a second control signal CONT2 from the timing controller 400. The scan driver 300 may generate first to n-th scan signals S1 to Sn according to the second control signal CONT2. The scan driver 300 may provide the generated first to n-th scan signals S1 to Sn to the display panel 100.

The timing controller 400 may receive an image signal RGB and a control signal CS from an external source of the display device. The timing controller 400 may generate the image data DATA, the first control signal CONT1 and the second control signal CONT2 after processing the signals supplied from the outside in accordance with the operation conditions of the display panel 100. The timing controller 400 will be described in more detail with reference to FIGS. 4 and 5.

Figure 2:
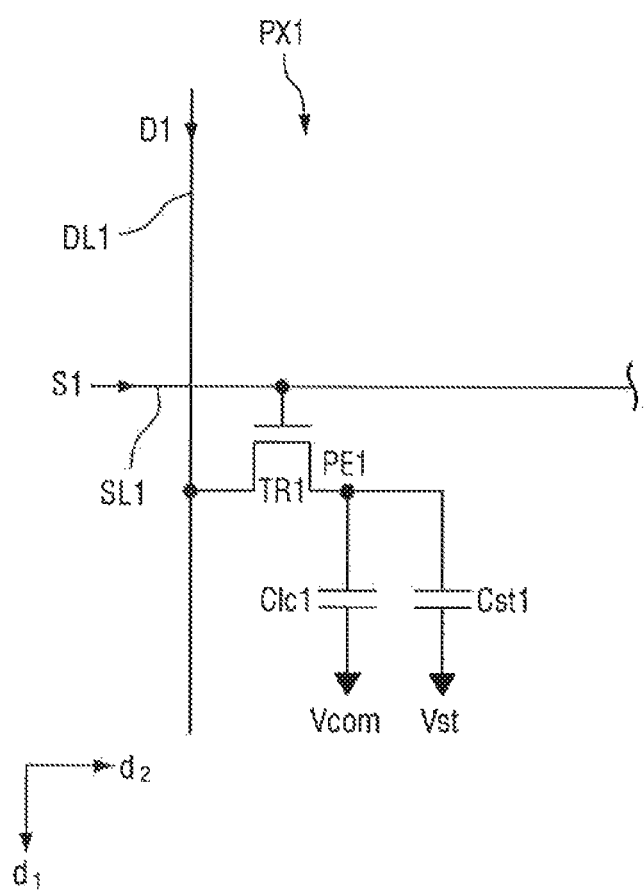
FIG. 2 is an equivalent circuit diagram showing an embodiment of a first pixel in the configuration of the display device shown in FIG. 1.

FIG. 2 is an equivalent circuit diagram showing the pixel PX1 from the embodiment of FIG. 1. A description of FIG. 2 will now be given in reference to the first pixel PX1, which is electrically connected to the first data line DL1, and the first scan line SL1, respectively.

The first pixel PX1 may include, for example, a first switching element TR1 and a first pixel electrode PE1.

The first switching element TR1 may be, for example, a three-terminal element such as a thin-film transistor in an embodiment. In the first switching element TR1, a control electrode may be electrically connected to the first scan line SL1, and one electrode may be electrically connected to the first data line DL1. The other electrode of the first switching element TR1 may be electrically connected to the first pixel electrode PE1.

The first switching element TR1 may be turned on in response to the first scan signal S1 of a high level provided to the gate, and in which the signal S1 is supplied from the first scan line SL1, so that the first data signal D1 supplied from the first data line DL1 can be provided to the first pixel electrode PE1. Meanwhile, although the illustration of FIG. 2 described herein shows that the first pixel PX1 includes only one switching element TR1, the present disclosure is not limited thereto, and two or more switching elements may be included in the first pixel PX1. Also, depending on the type of the first switching element TR1, the first switching element TR1 may be turned on in response to the first scan signal S1 having a low level rather than a high level. Herein, it is illustrated that the switching element is turned on in response to the scan signal having a high level.

The first pixel PX1 may further include a first liquid crystal capacitor Clc1 formed between the first pixel electrode PE1 and a common electrode (not shown) to which a common voltage Vcom is supplied. The first pixel PX1 may further include a first storage capacitor Cst1 formed between the first pixel electrode PE1 and a storage electrode (not shown) to which a storage voltage Vst is supplied.

Figure 3:
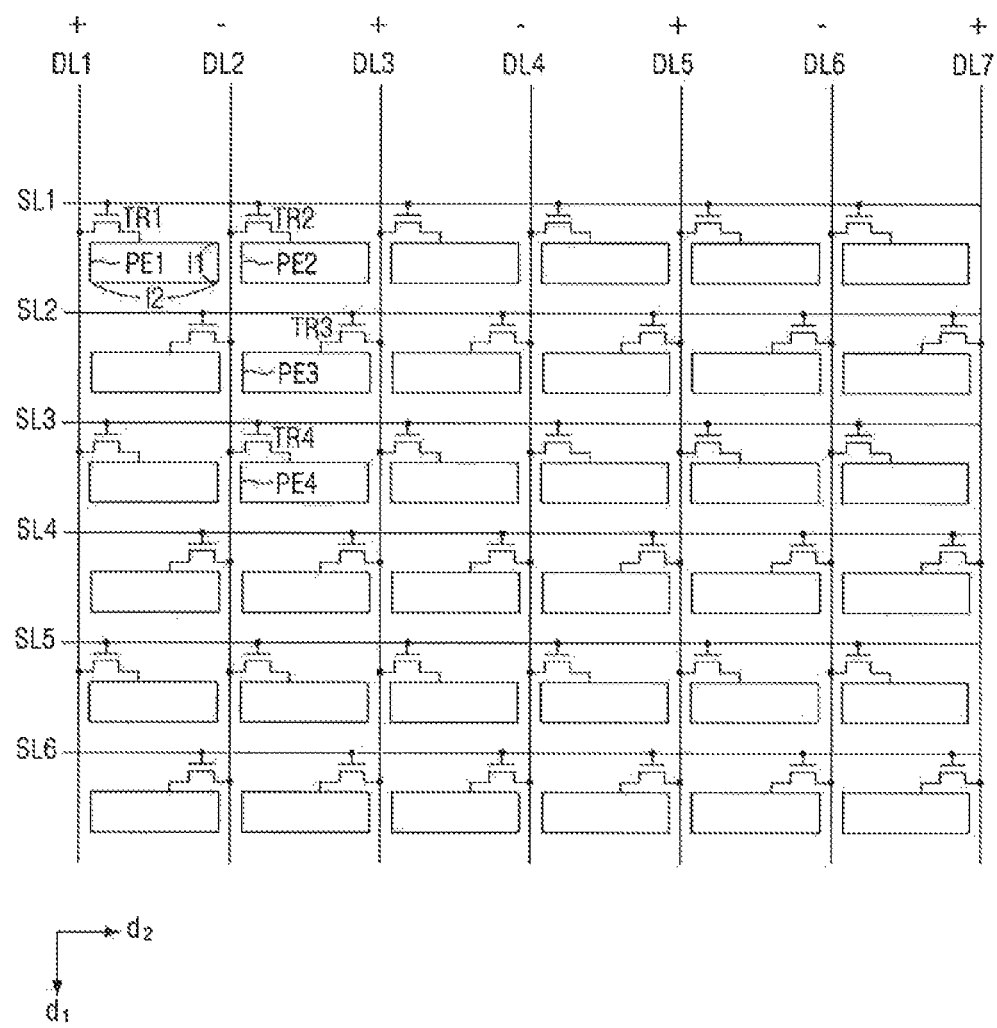
FIG. 3 is a view schematically showing an embodiment of the arrangement of a plurality of pixels in the configuration of the display device shown in FIG. 1.

FIG. 3 is a view schematically depicting the arrangement of the plurality of pixels in the configuration of the display device shown in FIG. 1.

Referring now to FIG. 3, each of the plurality of pixels shown includes a switching element and a pixel electrode. Hereinafter, the shape of the pixel electrode will be described in reference to the first pixel electrode PE1. As can be seen and appreciated by a person of ordinary skill in the art, the first pixel electrode PE1 has a vertical length l1, which is smaller than a horizontal length l2. In other words, the first pixel PX1 may include the first pixel electrode PE1 having a horizontal length longer than a vertical length as illustrated in FIG. 3. In the case where, for example, the vertical length l1 is smaller than the horizontal length l2, the shape of the first pixel electrode PE1 and the vertical length l1 and the horizontal length l2 of the first pixel electrode PE1 would be different than shown in FIG. 3. Thus, the inventive concept is not limited to the pixel electrode shape shown in FIG. 3.

The plurality of pixels may further include second to fourth pixels PE2 to PE4 electrically connected to the second data line DL2. The arrangement of the plurality of pixels will be described in reference to the second to fourth pixels PE2 to PE4.

Each of the second to fourth pixels PE2 to PE4 may be electrically connected to the second data line DL2. Also, the second to fourth pixels PE2 to PE4 may be electrically connected to different scan lines, respectively.

The second to fourth pixels PE2 to PE4 may display different colors. In one embodiment, the second pixel PX2 may display red, and the third pixel PX3 may display green. Further, the fourth pixel PE4 may display a blue light. For example, the second to fourth pixels PX2 to PX4 may display different colors using the data signal supplied from the second data line DL2. Thus, the display device according to an embodiment of the present inventive concept can drive three pixels, which display different colors using one data line, to reduce the number of data lines that are used.

The first to sixth data lines DL1 to DL6 may receive the data signals having polarities of (+)(−)(+)(−)(+)(−), respectively. Alternatively, the first to sixth data lines DL1 to DL6 may receive the data signals having polarities of (−)(+)(−)(+)(−)(+), respectively. For example, the first to sixth data lines DL1 to DL6 may receive the data signals whose polarities are inverted column by column, respectively.

Thus, according to the inventive concept, one pixel from among the plurality of pixels may receive a data signal having a polarity different from that of an adjacent pixel. However, the arrangement of the plurality of pixels is not limited to FIG. 3.

Although not shown in the drawings, a display device according to an embodiment of the present disclosure may include a plurality of pixels having pixel electrodes, each having a horizontal length shorter than a vertical length. In this case, among the plurality of pixels, the pixels arranged in the same column may be electrically connected to the same data line.

Figure 4:
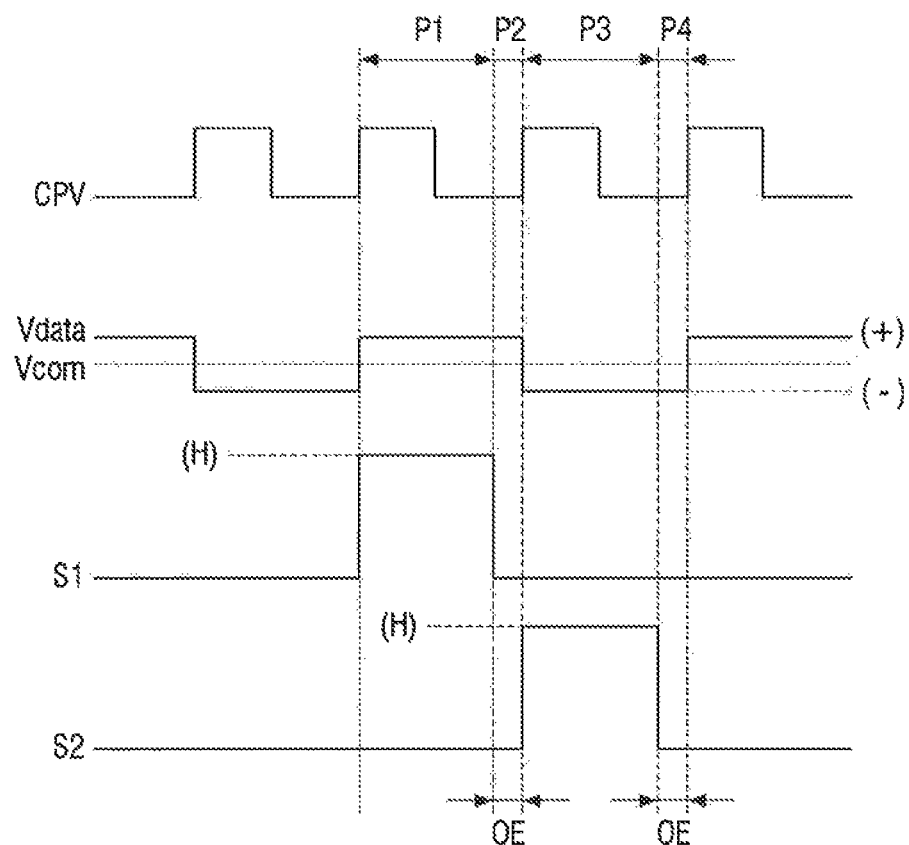
FIG. 4 is a diagram explaining an output enable in a display device according to an embodiment of the present inventive concept.

FIG. 4 is a timing diagram illustrating an output enable in a display device according to an embodiment of the present inventive concept.

Referring to FIGS. 1, 2 and 4, the second control signal CONT2 may include a vertical start signal and a gate clock signal CPV. The scan driver 300 may output the first to n-th scan signals S1 to Sn including the first scan signal S1 and the second scan signal S2 based on the vertical start signal and the gate clock signal CPV.

The polarity of the first to m-th data signals D1 to Dm may be inverted every period. In an embodiment, the first polarity (+) may have a voltage level higher than the common voltage Vcom and the second polarity (−) may have a voltage level lower than the common voltage Vcom may be repeated every period.

Hereinafter, the first and second scan signals S1 and S2 will be described in an example, with particular reference to FIG. 4.

In a first period P1 within one frame, the first scan signal S1 having a high-level H may be outputted through the first scan line SL1 (see FIG. 1). Here, the high level H of the first scan signal S1 may be a turn-on voltage capable of turning on the first switching element TR1 to which the first scan signal S1 is provided. Accordingly, the first switching element TR1 is turned on, so that a data signal having the first polarity (+) can be outputted through the first data line DL1.

In a third period P3, the second scan signal S2 having a high-level H, may be outputted through the second scan line SL2 (see FIG. 1). The high-level H of the second scan signal S2 may be a turn-on voltage capable of turning on the switching element to which the second scan signal S2 is provided. Accordingly, the data signal having the second polarity (−) can be outputted through the first data line DL1.

Here, the timing controller 400 provides the scan driver 300 with the second control signal CONT2 including an output enable (OE) value to be described later, so that the length of the second period P2 and the fourth period P4 can be adjusted.

In more detail, the second period P2 may be defined as a period from a falling edge of the turn-on signal of the high-level H in the first scan signal S1 to a rising edge of the turn-on signal of the high-level H in the second scan signal S2.

The fourth period P4 may be defined as being a period of time measured from a falling edge of the turn-on signal of the high level H in the second scan signal S2 to a rising edge of the turn-on signal of the high level H in a third scan signal (not shown) following the second scan signal S2.

Here, the second period P2 and the fourth period P4 are defined as an output enable (OE). The length of the second period P2 and the fourth period P4 is defined as an output enable (OE) value.

An output enable (OE) disposed between the first period P1 and the third period P3 will be described as an example. The output enable (OE) may be disposed between the first period P1 and the third period P3. Accordingly, it is possible to prevent collision between the data signal provided during the first period P1 and the data signal provided during the third period P3, to prevent a blurring phenomenon in which colors are mixed.

Figure 5:
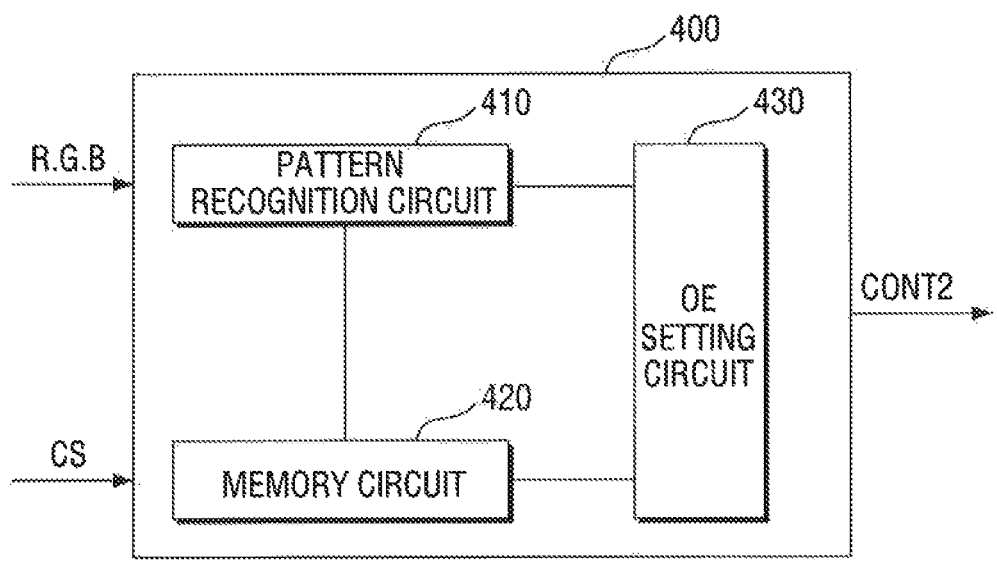
FIG. 5 is a diagram of a timing controller depicted in FIG. 1 in more detail.
Figure 6:
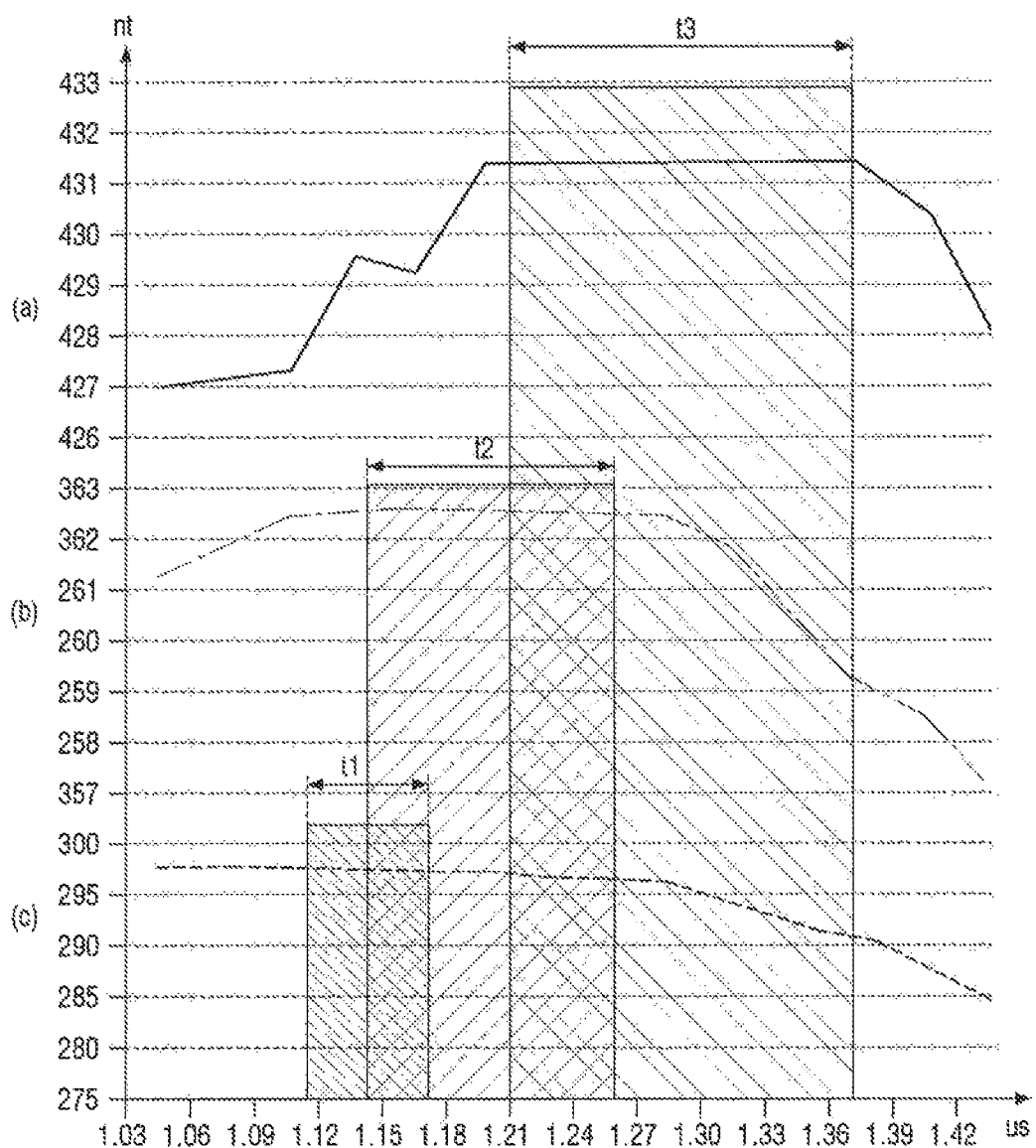
FIG. 6 is a graph showing the luminance according to an output enable value of a representative pattern.
Figure 7:
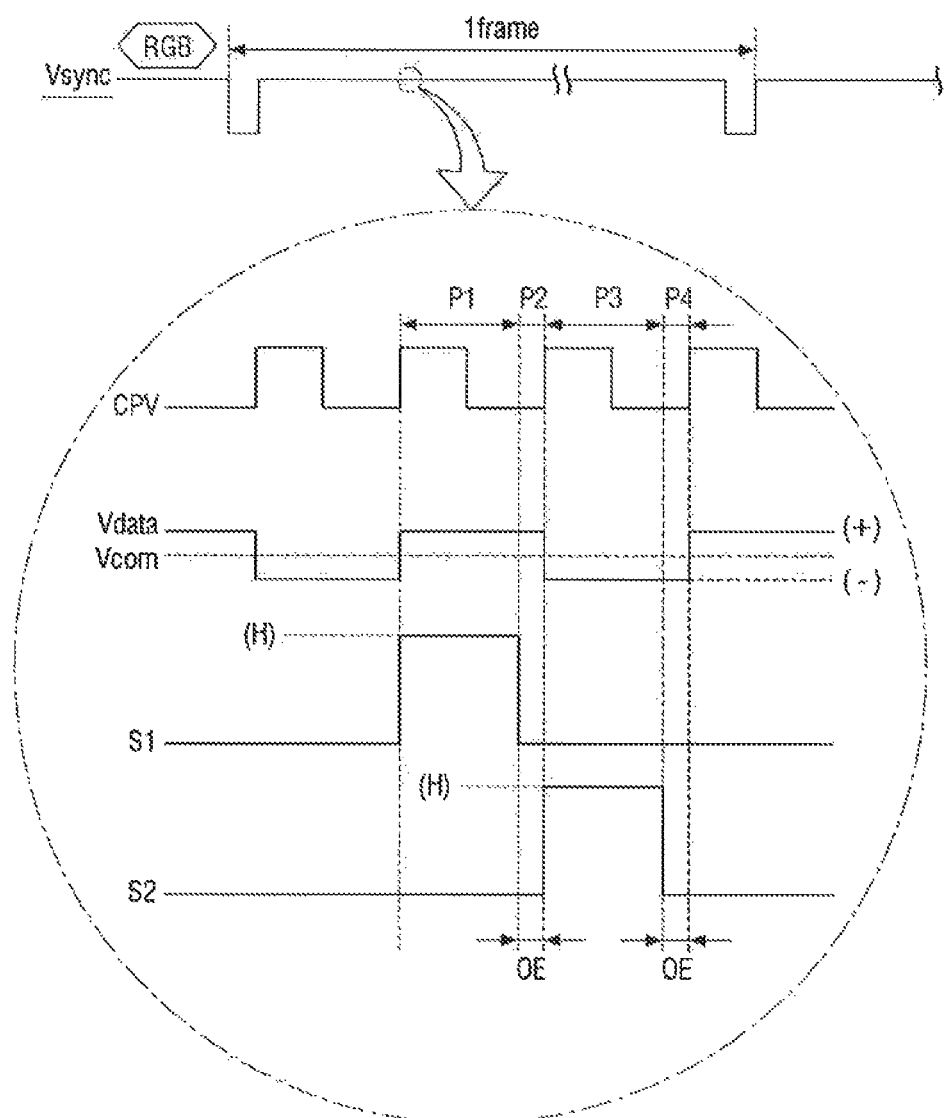
FIG. 7 is a diagram explaining a method of selecting an optimal output enable of a display device according to an embodiment of the present inventive concept.

FIG. 5 is a diagram showing the timing controller shown in FIG. 1 in more detail. FIG. 6 is a graph showing the luminance according to the output enable value of a representative pattern. FIG. 7 is a diagram explaining a method of selecting an optimal output enable of a display device according to an embodiment of the present inventive concept.

A method for driving a display device according to an embodiment of the present inventive concept will be described with reference to FIGS. 1, 5, 6 and 7.

The timing controller 400 may identify a color pattern of an image signal RGB supplied from the external source and set an optimal output enable (OE) value according to the type of the recognized pattern.

More specifically, the timing controller 400 may include a pattern recognition circuit 410, a memory 420, and an OE setting circuit 430.

The pattern recognition circuit 410 may recognize the color pattern of the image signal RGB provided from the outside. Here, the color pattern may be a monochromatic pattern, a mixed color pattern, or a white pattern.

The monochromatic pattern is defined as one color pattern, which is not combined with another color. The monochromatic pattern may, in one embodiment, include a blue pattern, a green pattern, and a red pattern. On the other hand, the mixed color pattern is defined as a color pattern generated by a combination of two colors. The mixed color pattern may include a cyan pattern, a magenta pattern and a yellow pattern, in one embodiment. It is within the inventive concept that the white color pattern could be a combination of colors greater than two. In this embodiment, the white pattern is defined as a color pattern generated by a combination of three or more colors.

The image signal RGB may include pattern data having three-digit bits. Each digit number of the pattern data may be 1 or 0. Accordingly, the image signal RGB may be classified according to the color type as shown in Table 1 below.

TABLE 1

| Color Pattern | Pattern Data | Color Type |
| --- | --- | --- |
| Monochromatic Pattern | 100 | Blue |
|  | 010 | Green |
|  | 001 | Red |
| Mixed Color Pattern | 110 | Cyan |
|  | 101 | Magenta |
|  | 011 | Yellow |
| White Pattern | 111 | White |

For example, the pattern recognition circuit 410 may recognize (e.g. identify by operation of one or more comparators the color pattern of the image signal with a list or table of patterns in storage, such as the above table) the color pattern of the image signal RGB based on the pattern data of the image signal RGB supplied from the external source. Referring to FIG. 7, in one embodiment, the pattern recognition circuit 410 may recognize the color pattern of the image signal RGB on a per frame basis. For example, the pattern recognition circuit 410 may recognize the color pattern of the image signal RGB on frame by frame, and provides the result to the memory 420 or the OE setting circuit 430 for each frame.

Referring again to FIG. 5, the memory 420, which is a non-transitory memory, may store an optimal output enable (OE) value corresponding to the particular color pattern identified by the pattern recognition unit. In one embodiment, the memory 420 may store an optimal output enable (OE) value for each color pattern in the form of a look-up table (LUT). Here, the look-up table (LUT) may be constituted by a nonvolatile memory such as an EEPROM or the like. However, a person of ordinary skill in the art should understand and appreciate that the inventive concept is not limited to the use of a lookup table.

Here, the optimal output enable (OE) value may be set in consideration of the charging rate and the blurring phenomenon. The charging rate is a change amount of an actual pixel electrode voltage, which is expressed as a percentage, when a voltage change amount of the pixel electrode for a predetermined time is regarded as 100.

The first and second periods P1 and P2 will be described in an example with reference to FIG. 7. An artisan should understand and appreciate that the present inventive concept is not limited to the illustration shown in FIG. 7.

When the output enable (OE) value becomes larger, the length of time of the first period P1 may be relatively shorter. In this case, the switching element cannot secure a sufficient switching time, and the charging rate may be reduced. Particularly, in the case of the pixel electrode structure having the horizontal length l2 longer than the vertical length l1 as shown in FIG. 3, if the required charging rate is not secured, a failure phenomenon (in which the luminance of the display panel 100 becomes non-uniform) may become severe.

On the other hand, when the output enable (OE) value becomes smaller, the length of the first period P1 may become relatively longer and the length of the second period P2 may become relatively short. In this case, an interval of time between the third period P3 and the first period P1 is reduced, and the above-described blurring phenomenon may occur.

Referring again to FIG. 5, the memory 420 may store an optimal output enable (OE) value corresponding to the color pattern. In one embodiment, the memory 420 may store an optimal output enable (OE) value corresponding to each particular color pattern.

Alternatively, the memory 420 may store the optimal output enable (OE) value according to the representative pattern. Here, the representative pattern may be one of monochromatic patterns or one of mixed color patterns. For example, in the case of a monochromatic pattern, a green pattern may be set as a representative pattern, and in the case of a mixed color pattern, a cyan pattern including a green pattern may be set as a representative pattern.

Accordingly, the memory 420, which comprises non-transitory storage, may store the optimal output enable (OE) value corresponding to the green pattern, the optimal output enable (OE) value corresponding to the cyan pattern, and the optimal output enable (OE) value corresponding to the white pattern, respectively. A person of ordinary skill in the art should understand and appreciate that a memory controller (not shown) may be part of the memory 420.

Meanwhile, although it is illustrated in FIG. 5 that the memory 420 is included as part of the timing controller 400, the present disclosure is not limited thereto. For example, the memory 420 may be arranged outside of the timing controller 400, and may be coupled to an interface of a memory controller of memory 420. In addition, the memory 420 may be formed by allocating a partial area of a memory included in the display device without adding a separate memory. The partial area of the memory of the display device may be dedicated to storage related to the operation of the timing controller 400. However, the inventive concept is not limited to such constructions.

Table 2 shows the luminance (nt) according to the output enable (OE) value in microseconds of the representative pattern. Here, the high luminance means that the voltage level applied to the pixel electrode is high, which may indicate that the charging rate is high. Further, the smaller the output enable (OE) value, the greater is the probability of occurrence of the blurring phenomenon. Accordingly, the output enable (OE) having the largest value (e.g. of time) in the period with the highest luminance may be set as an optimal output enable (OE).

TABLE 2

| Output Enable (OE, us) | Green Pattern | Cyan Pattern | White Pattern |
|---|---|---|---|
| 1.03 | 297.7 | 361.2 | 426.9 |
| 1.06 | 297.8 | 361.8 | 427.1 |
| 1.09 | 297.9 | 362.4 | 427.3 |
| 1.12 | 297.9 | 362.5 | 429.8 |
| 1.15 | 297.9 | 362.6 | 429.5 |
| 1.18 | 297.9 | 362.6 | 431.6 |
| 1.21 | 297.1 | 362.6 | 431.7 |
| 1.24 | 296.9 | 362.6 | 431.7 |
| 1.27 | 296.2 | 362.5 | 431.7 |
| 1.30 | 294.3 | 361.9 | 431.7 |
| 1.33 | 292.2 | 360.5 | 431.7 |
| 1.36 | 290.5 | 359.1 | 431.7 |
| 1.39 | 287.7 | 358.5 | 430.6 |
| 1.42 | 285.2 | 357.3 | 428.6 |

An example will be described with reference to Table 2 and FIG. 6.

In the case of a green pattern, 1.18, which is the largest value in a period t1 (FIG. 6) from 1.09 to 1.18 with the highest luminance, may be set as the optimal output enable (OE) value. In the case of a cyan pattern, 1.24, which is the largest value in a period t2 from 1.15 to 1.24 with the highest luminance, may be set as the optimal output enable (OE) value. Further, in the case of a white pattern, 1.36, which is the largest value in a period t3 from 1.21 to 1.36 with the highest luminance, may be set as the optimal output enable (OE) value.

For example, referring to Table 2 and FIG. 6, it can be seen that the optimal output enable (OE) value differs for each color pattern. In particular, it can be seen that the optimal output enable (OE) value differs greatly between a monochromatic pattern with a low gray level and a white pattern with a high gray level.

The OE setting circuit 430 may search the memory 420 to select an optimal output enable (OE) value corresponding to the particular color pattern provided from the pattern recognition circuit 410. The OE setting circuit 430 may provide the selected output enable (OE) value to the scan driver 300 to adjust an interval between high levels of the scan signals. Here, in one embodiment, the OE setting circuit 430 may select an optimal output enable (OE) value on the basis of one frame basis to adjust the interval between the high levels of the scan signals. However, without being limited to one frame, the optimal output enable (OE) value may be selected on the basis of two or more frames.

Figure 8:
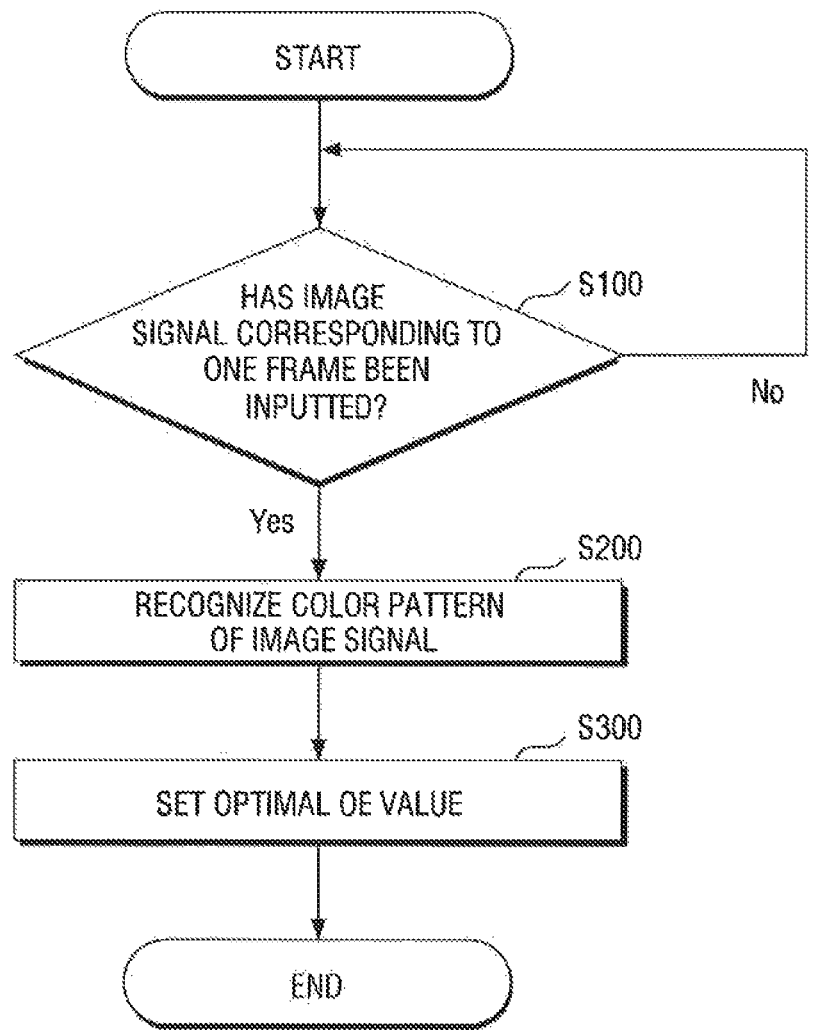
FIG. 8 is a flowchart illustrating a method for driving a display device according to an embodiment of the present inventive concept.

FIG. 8 is a flowchart illustrating a method for driving a display device according to an embodiment of the present inventive concept.

Referring to FIGS. 1, 6 and 8, the timing controller 400 may recognize (e.g. identify) a color pattern of an image signal RGB provided from the outside, set an optimal output enable (OE) value corresponding to the identified color pattern, and provide the value to the scan driver 300. The scan driver 300 may generate first to n-th scan signals S1 to Sn based on the output enable (OE) and provide the first to the n-th scan signals S1 to Sn to the display panel 100.

More specifically, the pattern recognition circuit 410 may receive an image signal RGB from an exterior source on the basis of, in this example, one frame. At operation (S100), the pattern recognition circuit 410 may check whether an image signal RGB corresponding to one frame has been provided. Here, one frame is illustrative, and it may be driven on the basis of a plurality of frames.

Next, at operation (S200), the pattern recognition circuit 410 may identify a color pattern of the provided image signal RGB. In an embodiment, the image signal RGB may include pattern data having three-digit bits. The pattern recognition circuit 410 may identify whether the pattern is a monochromatic pattern, a mixed color pattern, or a white pattern using the pattern data in the image signal RGB.

More specifically, the pattern recognition circuit 410 may identify the color pattern of the image signal RGB as a monochromatic pattern if the pattern data is one of 100, 010 and 001. Further, the pattern recognition circuit 410 may identify the color pattern of the image signal RGB as a mixed color pattern if the pattern data is one of 110, 101 and 011. Further, the pattern recognition circuit 410 may recognize the color pattern of the image signal RGB as a white pattern if the pattern data is 111.

Next, at operation (S300), the pattern recognition circuit 410 may provide the recognized color pattern of the image signal RGB to the OE setting circuit 430. The OE setting circuit 430 may set an optimal output enable (OE) value using the color pattern.

More specifically, in one embodiment of the inventive concept, the OE setting circuit 430 may search the memory 420 for an optimal output enable (OE) value corresponding to the color pattern of the image signal RGB, and set the search result as an optimal output enable (OE) value.

In another embodiment of the inventive concept, the OE setting circuit 430 may set a representative pattern. For example, if the color pattern of the image signal RGB recognized by the pattern recognition circuit 410 is one of the monochromatic patterns, the optimal output enable (OE) value corresponding to the green pattern, which is a representative pattern of the monochromatic pattern, may be set as an optimal output enable (OE) value of the corresponding frame. Alternatively, if the color pattern of the image signal RGB recognized by the pattern recognition circuit 410 is one of the mixed color patterns, the optimal output enable (OE) value corresponding to the cyan pattern, which is a representative pattern of the mixed color pattern, may be set as an optimal output enable (OE) value of the corresponding frame. For example, since the memory 420 does not need to store the output enable (OE) values corresponding to the remaining patterns other than the representative pattern, the capacity efficiency of the memory 420 can be increased. Meanwhile, although a case where the representative pattern of the monochromatic pattern is a green pattern and the representative pattern of the mixed color pattern is a cyan pattern has been described as an example, the present inventive concept is not limited thereto.

Thereafter, the OE setting circuit 430 may provide the set optimal output enable (OE) value to the scan driver 300. The scan driver 300 may generate first to n-th scan signals S1 to Sn based on the provided optimal output enable (OE) value and output the generated first to n-th scan signals S1 to Sn to the display panel 100.

Figure 9:
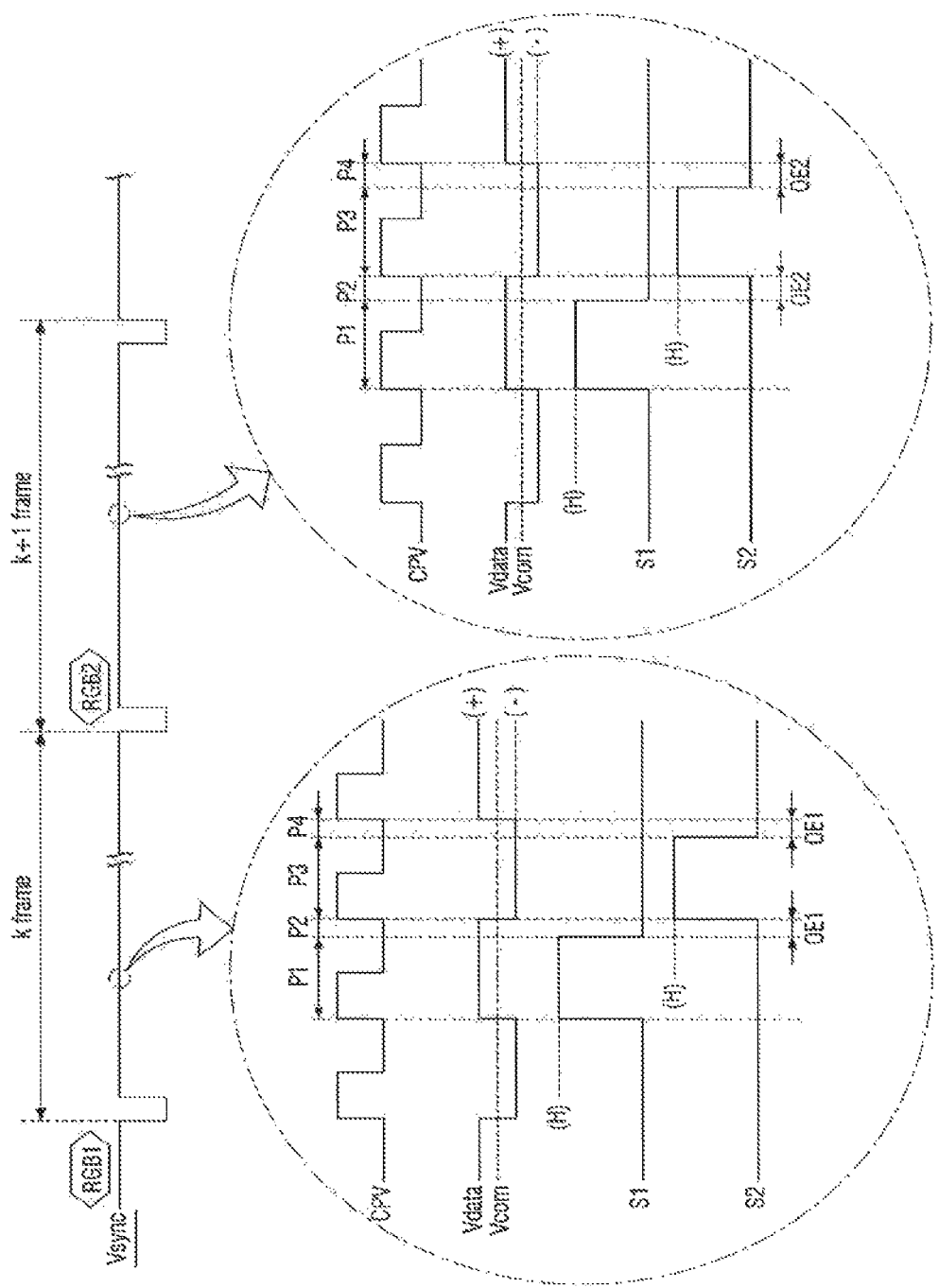
FIG. 9 is a timing chart illustrating the method for driving a display device according to an embodiment of the present inventive concept as illustrated in FIG. 8.

FIG. 9 is a timing chart illustrating the method for driving a display device according to an embodiment of the present inventive concept as illustrated in FIG. 8. However, a repeated description similar to those described with reference to FIG. 8 will be omitted. Further, an i-th scan signal Si (i is a natural number of 1 or greater) and an (i+1)-th scan signal Si+1 will be described as an example.

Referring to FIGS. 5, 8 and 9, a first image signal RGB1 may be provided in a k-th frame (k is a natural number of 1 or greater). Here, it is assumed that the first image signal RGB1 has pattern data of 001.

The pattern recognition circuit 410 checks whether the first image signal RGB1 corresponding to the k-th frame has been inputted. Then, the pattern recognition circuit 410 may identify the color pattern of the first image signal RGB1 using the pattern data included in the first image signal RGB1. As described above, since the first image signal RGB1 has the pattern data of 001, the color pattern of the first image signal RGB1 may be identified as a red pattern.

Next, the OE setting circuit 430 may set an optimal first output enable (OE1) value based on the color pattern of the first image signal RGB1 supplied from the pattern recognition circuit 410. Since the color pattern of the first image signal RGB1 is a red pattern, the OE setting circuit 430 may set an optimal first output enable (OE1) value corresponding to the red pattern through the search of the memory 420. The OE setting circuit 430 may provide the set optimal first output enable (OE1) value to the scan driver 300.

In an embodiment of the inventive concept, since the color pattern of the first image signal RGB1 is a red pattern, the OE setting circuit 430 may set an optimal first output enable (OE1) value corresponding to a green pattern, which is a representative pattern of a monochromatic pattern, through the search of the memory 420.

Thereafter, in the (k+1)-th frame, a second image signal RGB2 may be provided. Here, it is assumed that the second image signal RGB2 has pattern data of 101.

The pattern recognition circuit 410 checks whether the second image signal RGB2 corresponding to the (k+1)-th frame has been inputted. Then, the pattern recognition circuit 410 may recognize the color pattern of the second image signal RGB2 using the pattern data included in the second image signal RGB2. As described above, since the second image signal RGB2 has the pattern data of 101, the color pattern of the second image signal RGB2 may be identified as a magenta pattern.

Next, the OE setting circuit 430 may set an optimal second output enable (OE2) value based on the color pattern of the second image signal RGB2 supplied from the pattern recognition circuit 410. Since the color pattern of the second image signal RGB2 is a magenta pattern, the OE setting circuit 430 may set an optimal second output enable (OE2) value corresponding to the magenta pattern through the search of the memory 420. It can be seen from FIG. 9 that the optimal OE2 for the magenta pattern is greater than the OE1 for the red pattern. The OE setting circuit 430 may provide the set optimal second output enable (OE2) value to the scan driver 300.

In another embodiment of the inventive concept, since the color pattern of the second image signal RGB2 is a magenta pattern, the OE setting circuit 430 may set an optimal second output enable (OE2) value corresponding to a cyan pattern, which is a representative pattern of a mixed color pattern, through the search of the memory 420.

Meanwhile, if the second image signal RGB2 provided in the (k+1)-th frame has the same pattern data as the first image signal RGB1, the OE setting circuit 430 may not search the memory 420. For example, the OE setting circuit 430 may provide the optimal first output enable (OE1) value set in the k-th frame to the scan driver 300 directly without changing the value.

For example, the display device according to an embodiment of the present inventive concept calculates an optimal output enable (OE) value for each color pattern and applies it differently for each predetermined frame, which may result in a sufficient charging rate, and prevent a blurring phenomenon.

Table 3 shows a degree of reduction in the charging rate according to the optimal output enable (OE) value for each color pattern.

TABLE 3

| OE | Green | Cyan | White |
| --- | --- | --- | --- |
| Green (1.18 us) | — | 0% | 0% |
| Cyan (1.24 us) | 0.3% | — | 0% |
| White (1.36 us) | 2.5% | 1.0% | — |

In one example, a case where an output enable (OE) value (1.36) corresponding to a white pattern is applied regardless of a color pattern type will be described. In this case, the charging rate is reduced by about 2.5% in the green pattern, which is a monochromatic pattern. Particularly, a reduction of the charging rate in a monochromatic pattern with a low gray level may cause a vertical moire phenomenon and a horizontal block phenomenon.

Accordingly, the display device according to an embodiment of the present disclosure recognizes the color pattern of the image signal RGB and sets the optimal output enable (OE) value according to the recognized color pattern. Therefore, it is possible to prevent a vertical moire phenomenon and a horizontal block phenomenon due to a reduction of the charging rate.

Although certain embodiments and implementations of the inventive concept have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
a display panel including a first scan line and a second scan line;
a timing controller configured to receive an image signal from an external source, identify a color pattern of the image signal and set an output enable value according to the color pattern,
a scan driver configured to receive the output enable value and output a first scan signal having a first turn-on signal to the first scan signal and output a second scan signal having a second turn-on signal to the second scan signal,
wherein the scan driver adjusts an interval between the first turn-on signal and the second turn-on signal based on the output enable value, and
wherein the timing controller sets the output enable value into a first output enable value when the color pattern is a mixed pattern, and
wherein the timing controller sets the output enable value into a second output enable value different from the first output enable value when the color pattern is a white pattern.

2. The display device of claim 1, wherein the first output enable value is smaller than the second output enable value.

3. The display device of claim 1, wherein the interval when the color pattern is the mixed pattern is smaller than the interval when the color pattern is the white pattern.

4. The display device of claim 1, wherein the mixed color pattern comprises one of a cyan pattern, a magenta pattern and a yellow pattern.

5. The display device of claim 1, wherein the timing controller sets the output enable value into a third output enable value different from the first output enable value when the color pattern is a monochromatic pattern.

6. The display device of claim 5, wherein the first output enable value is larger than the third output enable value.

7. The display device of claim 5, wherein the interval when the color pattern is the mixed pattern is larger than the interval when the monochromatic pattern is the white pattern.

8. The display device of claim 5, wherein the monochromatic pattern includes one of a green pattern, a red pattern and a blue pattern.

9. The display device of claim 1, wherein the timing controller sets the output enable value into a third output enable value different from the second output enable value when the color pattern is a monochromatic pattern.

10. The display device of claim 9, wherein the second output enable value is larger than the third output enable value.

11. The display device of claim 9, wherein the interval when the color pattern is the white pattern is larger than the interval when the monochromatic pattern is the white pattern.

12. The display device of claim 1, wherein the timing controller sets the output enable value every n frame period, where n is a positive integer.

13. The display device of claim 1, wherein the timing controller sets a representative pattern based on the color pattern and then sets the output enable value according to the representative pattern.

14. The display device of claim 13, wherein when the color pattern is the mixed color pattern, the representative pattern is a cyan pattern among the cyan pattern, a magenta pattern and a yellow pattern.

15. The display device of claim 13, wherein when the color pattern is the monochromatic pattern, the representative pattern is a green pattern among the green pattern, a red pattern and a blue pattern.

16. The display device of claim 1, wherein the display panel further includes data lines crossing the first scan line and the second scan line.

17. The display device of claim 16, further comprising a data driver providing data signals to the data lines,
wherein the data signals providing adjacent data lines among the data lines have different polarities.

18. The display device of claim 17, further comprising pixels electrically connected to the scan driver through the first scan line and the second scan line extending in a first direction, and electrically connected to the data driver through the data lines extending in a second direction intersecting the first direction, wherein the each of pixels includes a pixel electrode having a horizontal length extending in the first direction and a vertical length extending in the second direction, and wherein the horizontal length is longer than the vertical length.

19. The display device of claim 1, wherein the timing controller includes:

a pattern recognition circuit configured to receive the image signal and identify the color pattern;

a memory configured to store the output enable value according to the color pattern; and an OE setting circuit configured to set the output enable value based on the color pattern.

* * * * *